United States Patent [19]

Terayama

[11] 4,037,179
[45] July 19, 1977

[54] MECHANICAL FILTER DEVICE

[75] Inventor: Toshio Terayama, Tokyo, Japan

[73] Assignee: Kabushiki Kaisha Daini Seikosha, Japan

[21] Appl. No.: 595,143

[22] Filed: July 11, 1975

[30] Foreign Application Priority Data

July 15, 1974   Japan .................................. 49-80948

[51] Int. Cl.² ............................................. H03H 9/02
[52] U.S. Cl. ...................................... 333/71; 310/8.9; 310/25
[58] Field of Search ...................... 333/71, 72; 310/25, 310/8.9; 58/23 TF

[56]      References Cited
     U.S. PATENT DOCUMENTS 3,243,736   3/1966   Johnston ................................ 333/71
3,513,415   5/1970   Dostal ................................... 333/71

Primary Examiner—Paul L. Gensler
Assistant Examiner—David K. Moore
Attorney, Agent, or Firm—Robert E. Burns; Emmanuel J. Lobato; Bruce L. Adams

[57]            ABSTRACT

A mechanical filter device comprises a casing having housed therein a U-shaped tuning fork. A damper extends from the casing between adjoining vibratable tines of the tuning fork to effectively dampen abnormal vibrations of the tines caused by external shocks or impacts being applied to the casing. The damper is formed integrally with the casing as a one-piece structure from synthetic resin.

15 Claims, 7 Drawing Figures

MECHANICAL FILTER DEVICE

BACKGROUND OF THE INVENTION

This invention relates to a mechanical filter device having a damper for protecting a tuning fork from outer impact, shock and mechanical noises. In conventional filter devices, it is necessary to satisfy the following requirements 1. The mechanical filter should not undergo mis-action caused by mechanical noise during carrying,
2. The mechanical filter should not change its vibrating characteristics and should not break when subjected to a big outer impact.

In one conventional type, there is provided a soft supporting construction for the tuning fork of the mechanical filter and in another type, the mechanical filter has masses attached to the tuning fork at its leg portions for satisfying the above requirements.

However, in the former type mechanical filter, when the mechanical filter receives a strong outer impact such causes a permanent change of the vibrating characteristics where upon the filter becomes of inferior quality.

Further in the latter type mechanical filter, the head portion of the tuning fork becomes heavy and the anti-impact characteristics change for the worse.

Fig. 1 shows a cross sectional view of the conventional mechanical filter which comprises a terminal plate 2 mounted to a lower opened portion of a casing 1 whereby said casing 1 is sealed. A supporting rubber member 3 for supporting a tuning fork is positioned in a central recess portion of said terminal plate 2, the terminal pins 4 are respectively inserted and mounted on both side portions of said terminal plate 2. A U-shaped tuning fork 5 having vibratable tines is supported by said supporting rubber by embedding a stem portion 5a of the tuning fork into the supporting rubber member 3.

A weight member or mass 6 is attached to the end portion of each tuning fork tine and a piezoelectric element 7 is mounted on the lower side portions of the tuning fork tines and are electrically connected to the terminals 4 by lead wires.

The conventional mechanical filter is 7a and 7c, the lead wire 7b connecting the stem vibrates at a peculiar or spurious vibrating frequency when subjected to mechanical noise and even though the tuning fork 5 is softly supported by the supporting rubber member 3, such a said construction does not adequately protect the tuning fork against outer impact.

Further, the tuning fork is relatively heavy at its vibratable leg portions due to the masses 6 and therefore is likely to strike the inner wall of the casing and become damaged by the outer impact whereby there are many problems such as of breaking, falling of the peculiar vibrating frequency and increasing of the insertion loss. In order to eliminate the above drawback and insufficiency, the conventional mechanical filter was developed as indicated in Fig. 2, wherein a damper 8 is attached to both sides of the inner portion of said casing.

However, in devices having a small casing, the attaching of said damper to said casing is extremely cumbersome and takes a long time whereby it is not preferable to satisfy production requirements. Further when said mechanical filter having such a small casing undergoes the temperature test there is a good possibility of loosening the attached rubber member.

Fig. 3 shows the construction of attaching a frothy rubber member 9 to the leg portions of said tuning fork instead of said weight member 6, however, it is not preferable to use such a rubbery type material as it possesses a hygroscopic character and therefore greatly influences the particular vibrating frequency and hence is undesirable from the standpoint of stability of vibrational frequency.

OBJECT OF THE INVENTION

The present invention aims to eliminate the above noted difficulty and insufficiency, and therefore it is the primary object of the present invention to provide a mechanical filter device having a damper for protecting a tuning fork from clamage caused by outer mechanical shock and impact.

Another object of the present invention is to provide a small mechanical filter device having a low frequency band, and especially relating to an improvement of the mechanical filter device for a separately and selectively calling system.

BRIEF DESCRIPTION OF THE DRAWINGS

The above mentioned and further objects, features and advantages of the present invention will become more apparent from the followng description when taken in connection with the accompanying drawings, and wherein.

DETAILED DESCRIPTION OF THE INVENTION

This invention relates to a mechanical filter device having a damper for protecting a tuning fork from external mechanical shock and impact.

Figure 4:
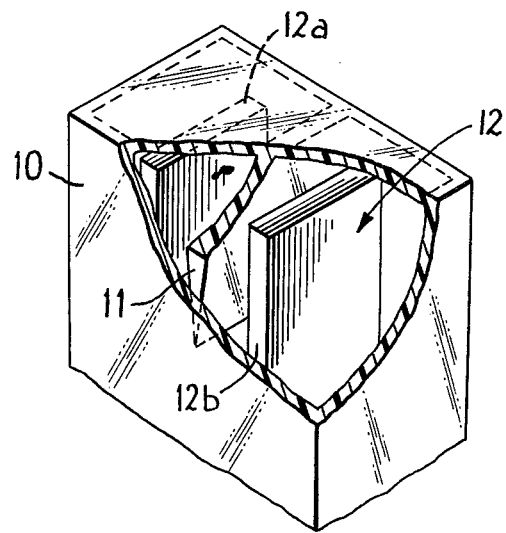

Referring now to the first embodiment of the invention shown in Fig. 4 the mechanical filter device of the present invention comprises a platelike damper 11 formed as an integral one-piece body with the central upper portion of the casing 10, both being made of transparent synthetic resin. The damper 11 is disposed in said casing 10 so as to not normally make contact with the tuning fork 12 and is disposed at the central portion of the casing and extends outwardly therefrom between the adjoining leg portions 12a and 12b of tuning fork 12 whereby said vibratable abnormal vibrations of the leg portions 12a and 12b of said tuning fork 12 are effectively dampened against any strong externally applied impact without a large transformation.

Figure 1:
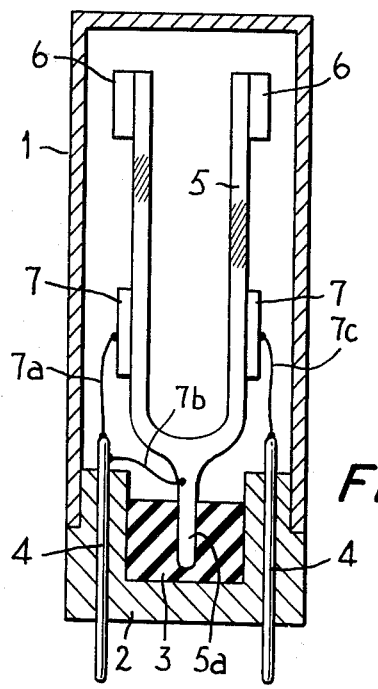
FIG. 1 shows a cross sectional view of the conventional mechanical filter device, FIG. 2
Figure 2:
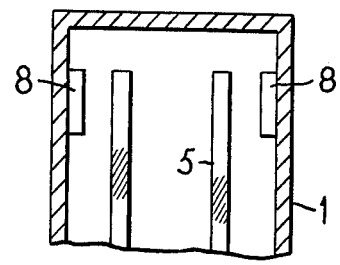
Figure 3:
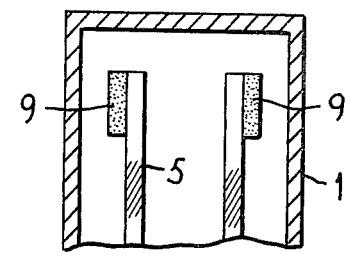
FIG. 3 shows cross sectional views of the other conventional mechanical filter devices, FIG. 4 to Fig. 7 respectively show perspective views each having a partial cutout portion, and each showing a different variant of mechanical filter device according to the present invention.
Figure 5:
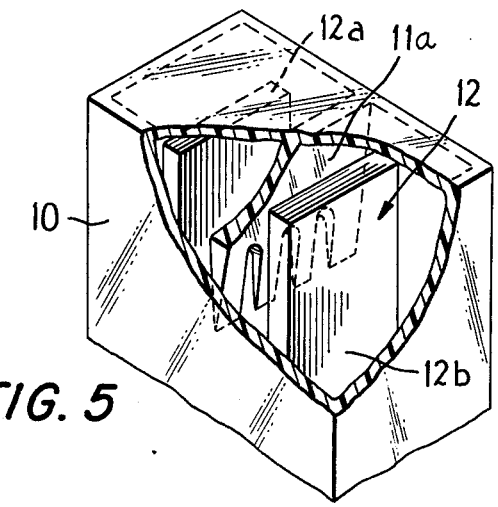

Fig. 5 shows another embodiment of the mechanical filter device of the present invention wherein the damper 11a has a comb shape instead of the plate shape of Fig. 4. The damper 11a absorbs any impact by the leg portions caused by the application of external shocks.

Figure 6:
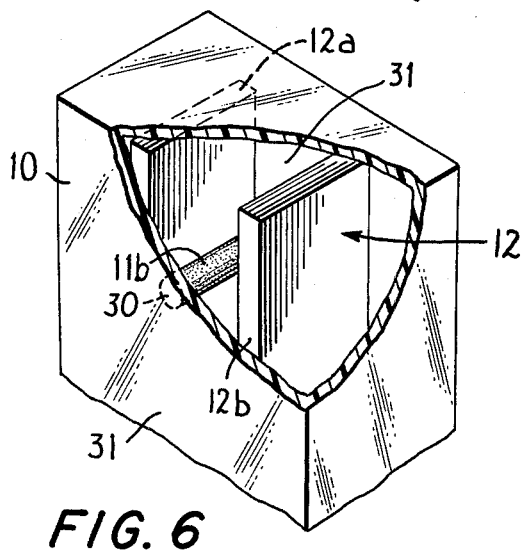

Fig. 6 shows the third embodiment of the mechanical filter device of the present invention wherein hole portions 30 are formed in the central upper portion of side wall 31 of the casing 10. A bar or wire-shaped damper 11b made of elastic material such as rubber, vinyl and the like is mounted in the casing 10 via said hole portion 30.

Figure 7:
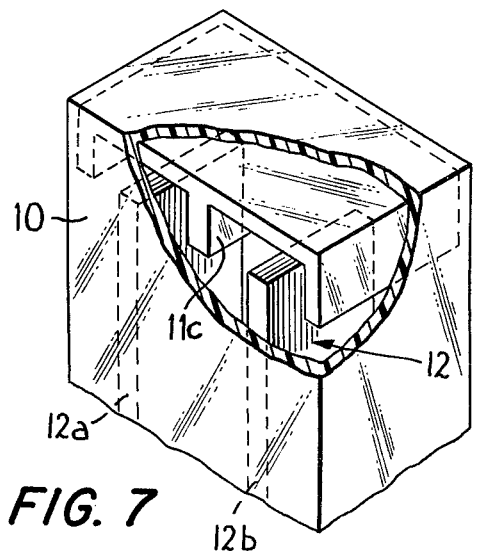

Fig. 7 shows the fourth embodiment of the mechanical filter device of the present invention and comprises a damper 11c having a generally E-shaped and being attached to the inner portion of the casing 10.

According to the present invention, the damper safely protects the tuning fork against outer shock, impact and noise.

It is possible to change the dampening effect by modifying the shape of said damper.

Further, when manufacturing the mechanical filter device, the dampers are constructed integrally with the casing as one body, thereby simplifying the making of the mechanical filter.

Furthermore, when attaching the E-shaped damper to said casing, the mounting or said damper is easily attained by a simple tool.

It is easy to check and detect the location and situation of said tuning fork in the casing by using a transparent or semi-transparent casing.

What we claimed is:

1. A mechanical filter device comprising: a casing having mounted therein a U-shaped tuning fork having vibratable leg portions, a damper positioned between said leg portions, said damper having a comb shape and being connected to said casing.

2. A mechanical filter device comprising: a casing having mounted therein a U-shaped tuning fork having vibratable leg portions, a damper positioned between said leg portions, said damper having a bar shape and being connected to said casing.

3. A mechanical filter device as claimed in claim 2 wherein said damper and said casing comprise a one piece integral body.

4. A mechanical filter device comprising: a casing having mounted therein a U-shaped tuning fork having vibratable leg portions, a damper positioned between said leg portions, said damper having a E-shape and being connected to said casing.

5. A mechanical filter device as claimed in claim 4, wherein said damper and said casing comprise a one piece integral body.

6. A mechanical filter device comprising: a casing; a tuning fork mounted to undergo vibration within said casing and having a set of vibratable leg portions; and dampening means connected to said casing and extending between adjoining ones of said vibratable leg portions so as to effectively dampen abnormal vibration of said leg portions caused by external shock or impact.

7. A mechanical filter device according to claim 6; wherein said casing and dampening means comprise a one-piece integral body.

8. A mechanical filter device according to claim 7; wherein said one-piece integral body is composed of synthetic resin.

9. A mechanical filter device according to claim 6; wherein said dampening means comprises a platelike member connected to one wall of said casing and extending outwardly therefrom.

10. A mechanical filter device according to claim 9; wherein said platelike member and said casing comprise an integral one-piece body composed of synthetic resin.

11. A mechanical filter device comprising: a casing; a tuning fork mounted to undergo vibration within said casing and having a set of vibratable leg portions; and dampening means connected to said casing and extending between adjoining ones of said vibratable leg portions and configured so as to not make contact with said leg portions during normal vibration thereof and to make contact with and effectively dampen abnormal vibration of said leg portions caused by external shock or impact.

12. A mechanical filter device according to claim 11 wherein said casing and dampening means comprise a one-piece integral body.

13. A mechanical filter device according to claim 12; wherein said one-piece integral body is composed of synthetic resin.

14. A mechanical filter device according to claim 11; wherein said dampening means comprises a platelike member connected to one wall of said casing and extending outwardly therefrom .

15. A mechanical filter device according to claim 14; wherein said platelike member and said casing comprise an integral one-piece body composed of synthetic resin.

* * * * *